US011537046B2

(12) United States Patent
Park et al.

(10) Patent No.: US 11,537,046 B2
(45) Date of Patent: Dec. 27, 2022

(54) PHOTORESIST COMPOSITION AND PHOTORESIST FILM USING THE SAME

(71) Applicant: LG CHEM, LTD., Seoul (KR)

(72) Inventors: Eun Seok Park, Daejeon (KR); Min Young Lim, Daejeon (KR); Ji Hye Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 359 days.

(21) Appl. No.: 16/626,091

(22) PCT Filed: Nov. 5, 2018

(86) PCT No.: PCT/KR2018/013324
§ 371 (c)(1),
(2) Date: Dec. 23, 2019

(87) PCT Pub. No.: WO2019/103353
PCT Pub. Date: May 31, 2019

(65) Prior Publication Data
US 2020/0209740 A1    Jul. 2, 2020

(30) Foreign Application Priority Data

Nov. 24, 2017 (KR) .......... 10-2017-0158924
Oct. 30, 2018 (KR) .......... 10-2018-0131270

(51) Int. Cl.
*G03F 7/033*   (2006.01)
*G03F 7/039*   (2006.01)
*C08F 220/18*  (2006.01)

(52) U.S. Cl.
CPC ........ *G03F 7/033* (2013.01); *C08F 220/1804* (2020.02); *G03F 7/039* (2013.01)

(58) Field of Classification Search
CPC ................. G03F 7/038; G03F 7/039
See application file for complete search history.

(56) References Cited

U.S. PATENT DOCUMENTS

| | | |
|---|---|---|
| 7,993,680 B2 | 8/2011 | Clemente et al. |
| 8,003,132 B2 | 8/2011 | Clemente et al. |
| 8,025,868 B2 | 9/2011 | Clemente et al. |
| 2004/0242446 A1 | 12/2004 | Mun et al. |
| 2009/0081589 A1* | 3/2009 | Toukhy ............... G03F 7/0392 430/327 |
| 2010/0028807 A1 | 2/2010 | Takemoto et al. |

(Continued)

FOREIGN PATENT DOCUMENTS

| | | |
|---|---|---|
| CN | 101546125 A | 9/2009 |
| CN | 101840155 A | 9/2010 |

(Continued)

OTHER PUBLICATIONS

Machine translation of JP 2012-230194 (2012).*

(Continued)

*Primary Examiner* — Martin J Angebranndt
(74) *Attorney, Agent, or Firm* — Rothwell, Figg, Ernst & Manbeck, P.C.

(57) ABSTRACT

The present invention relates to a photoresist composition capable of realizing excellent pattern performance during formation of fine patterns, and of preparing a photoresist film that is excellent in chemical stability of a plating solution, and a photoresist film using the same.

12 Claims, 2 Drawing Sheets

(56) References Cited

U.S. PATENT DOCUMENTS

| | | | |
|---|---|---|---|
| 2011/0045412 A1* | 2/2011 | Kaneko | C08F 290/00 |
| | | | 252/582 |
| 2012/0064455 A1 | 3/2012 | Yu et al. | |
| 2012/0133061 A1 | 5/2012 | Mitsukura et al. | |
| 2014/0154624 A1 | 6/2014 | Liu et al. | |
| 2016/0368879 A1 | 12/2016 | Ikeda et al. | |
| 2017/0062217 A1 | 3/2017 | Park et al. | |
| 2017/0153551 A1* | 6/2017 | Kume | H05K 3/064 |
| 2017/0168393 A1 | 6/2017 | Sugihara et al. | |
| 2018/0017866 A1 | 1/2018 | Kim et al. | |
| 2019/0121233 A1* | 4/2019 | Kawaue | G03F 7/40 |
| 2019/0384176 A1* | 12/2019 | Lim | C08K 5/3472 |
| 2020/0033727 A1* | 1/2020 | Ahn | G03F 7/033 |
| 2020/0039943 A1 | 2/2020 | Veiseh et al. | |
| 2020/0218153 A1* | 7/2020 | Park | G03F 7/0045 |

FOREIGN PATENT DOCUMENTS

| | | | |
|---|---|---|---|
| CN | 102964545 A | | 3/2013 |
| JP | 62-273260 | * | 11/1987 |
| JP | 06-043638 | * | 2/1994 |
| JP | 2000-338658 A | | 12/2000 |
| JP | 2000-352822 | * | 12/2000 |
| JP | 2004-109555 A | | 4/2004 |
| JP | 2007-321104 A | | 12/2007 |
| JP | 2012-088448 | * | 5/2012 |
| JP | 2012-194534 | * | 10/2012 |
| JP | 2012-230194 A | | 11/2012 |
| JP | 2013-080018 | * | 5/2013 |
| JP | 2013-105165 | * | 5/2013 |
| JP | 2013-152353 A | | 8/2013 |
| JP | 2015-028587 A | | 2/2015 |
| JP | 2016-502142 A | | 1/2016 |
| JP | 2019-529579 A | | 10/2019 |
| KR | 10-2004-0104001 A | | 12/2004 |
| KR | 10-2010-0003254 A | | 1/2010 |
| KR | 10-2010-0013264 A | | 2/2010 |
| KR | 10-2012-0027685 A | | 3/2012 |
| KR | 10-2015-0092164 A | | 8/2015 |
| KR | 10-2016-0030210 A | | 3/2016 |
| KR | 10-2016-0043787 A | | 4/2016 |
| KR | 10-2017-0018679 A | | 2/2017 |
| KR | 10-2017-0023569 A | | 3/2017 |
| KR | 10-2018-0007616 A | | 1/2018 |
| TW | 201127928 A | | 8/2011 |
| TW | 201610144 A | | 3/2016 |
| TW | 201624131 A | | 7/2016 |
| TW | 201638674 A | | 11/2016 |
| WO | 2013-147286 A1 | | 10/2013 |
| WO | 2016-136476 A1 | | 9/2016 |
| WO | 2017-034814 A1 | | 3/2017 |

OTHER PUBLICATIONS

Machine translation of JP 2012-194534 (2012).*
Machine translation of JP 06-043638 (1994).*
International Search Report issued for International Application No. PCT/KR2018/013324 dated Mar. 26, 2019, 3 pages.
Billing, M. et al., "Synthesis and complexation of well-defined labeled poly (N, N-dimethylaminoethyl methacrylate)s (PDMAEMA)", Polymers 2015, 7, pp. 2478-2493.

* cited by examiner

[FIG. 1]
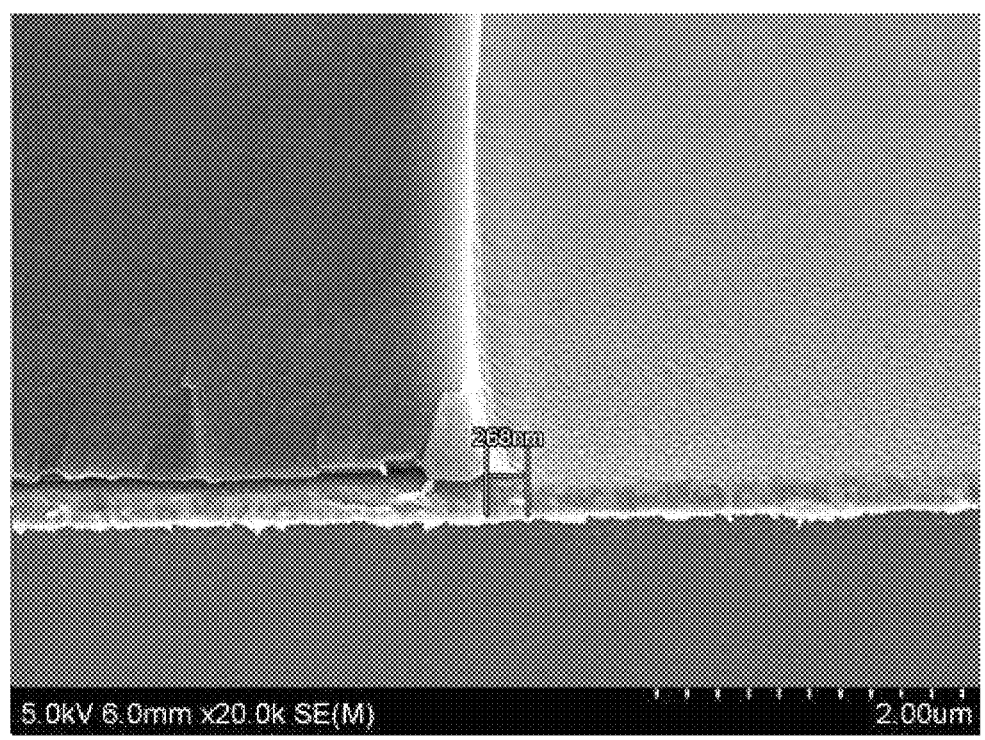

[FIG. 2]
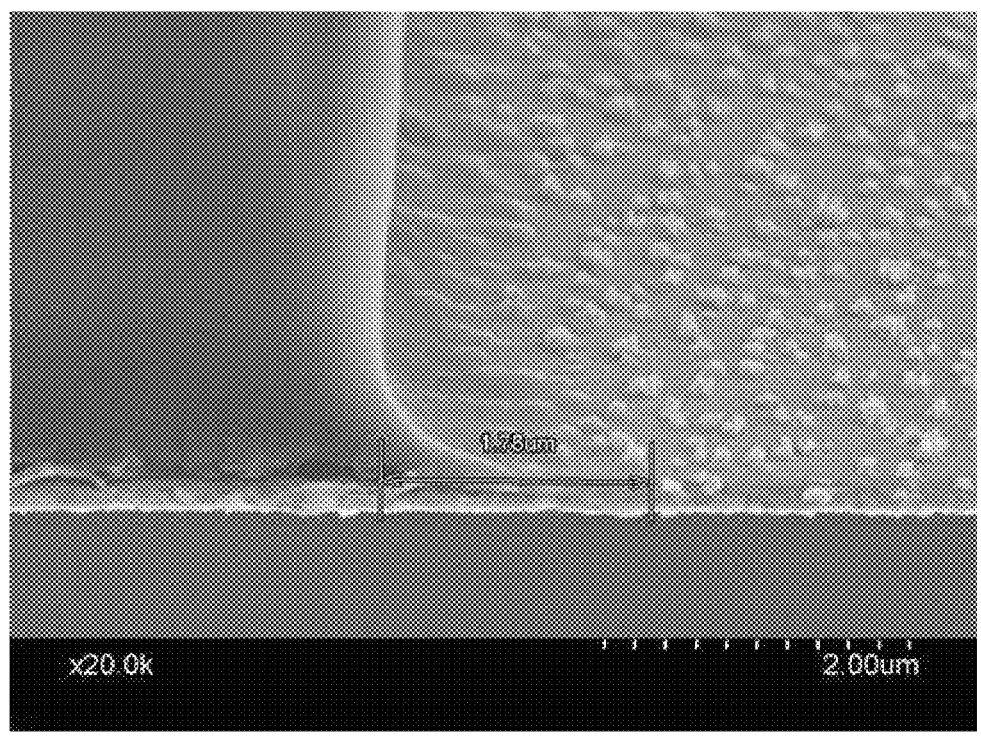

PHOTORESIST COMPOSITION AND PHOTORESIST FILM USING THE SAME

CROSS-REFERENCE TO RELATED APPLICATION(S)

This application is a 35 U.S.C. § 371 National Phase Entry Application from PCT/KR2018/013324, filed on Nov. 5, 2018, and designating the United States, claims the benefits of filing dates of Korean Patent Application No. 10-2017-0158924 filed with Korean Intellectual Property Office on Nov. 24, 2017 and Korean Patent Application No. 10-2018-0131270 filed with Korean Intellectual Property Office on Oct. 30, 2018, the entire contents of which are incorporated herein by reference.

The present invention relates to a photoresist composition and a photoresist film using the same. More specifically, the present invention relates to a photoresist composition capable of realizing excellent pattern performance during formation of fine patterns, and of preparing a photoresist film that is excellent in chemical stability of a plating solution, and a photoresist film using the same.

BACKGROUND ART

Photofabrication has become a mainstream microfabrication technology, and packaging technology continues to change into a process for manufacturing high density packages.

In particular, with the increase of the number of semiconductor input/output terminals, the use of flip chips is expanded and FOWLP (Fan-Out Wafer Level Packaging) technology is being introduced. Further, a TSV (Through Silicon Via) process enabling direct connection between chips is expanding for the purpose of minimizing signal delay. In this regard, the demand for bump technology is increased and the technical development of bump photoresists forming the same is considered to be very important.

In the case of a bump photoresist, (i) the sensitivity and resolution in a thick film ranging from 10 to 100 micrometers should be excellent, (ii) metal bumps should be formed through a plating process, and therefore pattern performance such as straightness, residue, footing, and notching properties should be good, and (iii) resistance to a plating solution should be excellent.

Accordingly, a photoresist is used in order to increase the sensitivity and resolution in a thick film. Generally, the above photoresist composition includes (a) a resin which is dissociated by an acid to increase its solubility in an alkali developing solution, (b) a photosensitive acid generator (photoacid generator), and (c) an acid diffusion control agent.

However, it is common to add a corrosion inhibitor to an existing photoresist composition, but there are problems that productivity in manufacturing the resist composition is lowered, such as solubility of the corrosion inhibitor being poor, the corrosion inhibitor not being dissolved well, or the stirring time being prolonged, and further that the corrosion inhibitor contained in the resist pattern is dissolved in the plating solution in the process of plating after formation of the resist pattern, thereby contaminating the plating solution.

In this regard, there is a demand for developing a novel photoresist composition that is capable of realizing excellent pattern performance during formation of fine patterns, and of preparing a photoresist film that is excellent in chemical stability of a plating solution.

DETAILED DESCRIPTION OF THE INVENTION

The present invention provides a photoresist composition that is capable of realizing excellent pattern performance during formation of fine patterns, and of preparing a photoresist film that is excellent in chemical stability of a plating solution.

The present invention also provides a photoresist film using the above-mentioned photoresist composition.

The present invention provides a photoresist composition including a (meth)acrylic resin containing a (meth)acrylic repeating unit and a functional group represented by the following Chemical Formula 1 bonded to the branched chain terminal of the repeating unit.

[Chemical Formula 1]

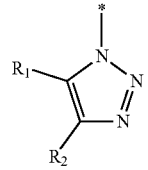

In Chemical Formula 1, $R_1$ and $R_2$ are each independently hydrogen, a carboxyl group, a polyoxyalkylene-based functional group, an alkyl group having 1 to 20 carbon atoms, or an aryl group having 6 to 20 carbon atoms, or $R_1$ and $R_2$ are connected to each other to form a cycloalkyl group having 3 to 20 carbon atoms.

The present invention also provides a photoresist film characterized in that a ratio of a footing length to a photoresist film thickness is 0.05 or less.

The present inventors found through experiments that when a photoresist composition including a (meth)acrylic resin in which a functional group having a specific structure as shown in Chemical Formula 1 is bonded to a branched chain terminal of the (meth)acrylic repeating unit is used, the pattern performance of the film obtained from the photoresist composition even without adding another corrosion inhibitor can be improved through the (meth)acrylic resin chemically bonded with the functional group of Chemical Formula 1 that is capable of functioning as a corrosion inhibitor, and it is possible to solve problems such as a reduction in miscibility and contamination of the plating solution, which are generated in a composition obtained by blending the corrosion inhibitor with the (meth)acrylic resin, thereby completing the present invention.

In particular, the functional group represented by Chemical Formula 1 can be easily introduced by a click reaction using an azide compound and an alkane compound as reaction precursors, and the synthesis of (meth)acrylic resin having various substituents is also easy.

Hereinafter, the photoresist composition and the photoresist film according to specific embodiments of the present invention will be described in detail.

Throughout the specification, when one part "includes" one constituent element, unless otherwise specifically described, this does not mean that another constituent element is excluded, but means that another constituent element may be further included.

In the present invention, the term "(meth)acrylic" is used with the meaning of including acrylic or methacrylic.

In the present invention, examples of substituents are described below, but are not limited thereto.

As used herein, the term "substituted" means that other functional groups instead of a hydrogen atom in the compound are bonded, and a position to be substituted is not limited as long as the position is a position at which the hydrogen atom is substituted, that is, a position at which the substituent can be substituted, and when two or more are substituted, the two or more substituents may be the same as or different from each other.

As used herein, the term "substituted or unsubstituted" means being unsubstituted or substituted with one or more substituents selected from the group consisting of deuterium; a halogen group; a cyano group; a nitro group; a hydroxyl group; a carbonyl group; an ester group; an imide group; an amide group; an amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an arylphosphine group; or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

As used herein, the notation , or  means a bond linked to another substituent group, and the direct bond means the case in which no separate atom is present at a part represented by L.

As used herein, the weight average molecular weight means a weight average molecular weight in terms of polystyrene measured by the GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions are as follows: a Waters PL-GPC220 instrument is used, Polymer Laboratories PLgel MIX-B, 300 mm column is used at an evaluation temperature of 160° C., 1,2,4-trichlorobenzene is used as a solvent, the flow rate is 1 mL/min, a sample is prepared at a concentration of 10 mg/10 mL and then fed in an amount of 200 µL, and the value of Mw can be determined using calibration curves formed from a polystyrene standard. The molecular weight of the polystyrene standards used herein is nine kinds of 2000/10,000/30,000/70,000/200,000/700,000/2,000,000/4,000,000/10,000,000.

In the present invention, the alkyl group may be straight-chained or branched, and the number of carbon atoms thereof is not particularly limited, but is preferably 1 to 40. According to an exemplary embodiment, the number of carbon atoms of the alkyl group is 1 to 20. According to another exemplary embodiment, the number of carbon atoms of the alkyl group is 1 to 10. According to another exemplary embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto. The alkyl group may be substituted or unsubstituted.

In the present invention, the alkoxy group may be a straight-chain, branched-chain, or cyclic chain. The number of carbon atoms of the alkoxy group is not particularly limited, but is preferably 1 to 30. Specifically, examples of the alkoxy group may include methoxy, ethoxy, n-propoxy, isopropoxy, i-propyloxy, n-butoxy, isobutoxy, tert-butoxy, sec-butoxy, n-pentyloxy, neopentyloxy, isobutyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, or the like, but are not limited thereto. The alkoxy group may be substituted or unsubstituted.

In the present invention, the cycloalkyl group is not particularly limited, but the number of carbon atoms thereof is preferably 3 to 60, and it may be a monocyclic cycloalkyl group or a polycyclic cycloalkyl group. According to an exemplary embodiment, the number of carbon atoms of the cycloalkyl group is 3 to 30. According to another exemplary embodiment, the number of carbon atoms of the cycloalkyl group is 3 to 20. According to another exemplary embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto. The cycloalkyl group may be substituted or unsubstituted.

In the present invention, the amine group may be selected from the group consisting of —NH$_2$, a monoalkylamine group, a dialkylamine group, an N-alkylarylamine group, a monoarylamine group, a diarylamine group, an N-arylheteroarylamine group, an N-alkylheteroarylamine group, a monoheteroarylamine group, and a diheteroarylamine group, and the number of carbon atoms thereof is not particularly limited, but is preferably 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenylbiphenylamine group, an N-phenylnaphthylamine group, an N-biphenylnaphthylamine group, a ditolylamine group, an N-phenyltolylamine group, a triphenylamine group, an N-naphthylfluorenylamine group, an N-phenylphenanthrenylamine group, an N-biphenyl phenanthrenyl amine group, an N-phenylfluorenyl amine group, an N-phenylterphenyl amine group, an N-phenanthrenyl fluorenyl amine group, a N-biphenylfluorenyl amine group, or the like, but are not limited thereto. The amine group may be substituted or unsubstituted.

In the present invention, the N-alkylarylamine group means an amine group in which an alkyl group and an aryl group are substituted with N of the amine group.

In the present invention, the N-arylheteroaryl amine group means an amine group in which an aryl group and a heteroaryl group are substituted with N of the amine group.

In the present invention, the N-alkylheteroaryl amine group means an amine group in which an alkyl group and a heteroaryl group are substituted with N of the amine group.

In the present invention, the alkyl group in the monoalkyl amine group, the dialkyl amine group, the N-arylalkyl amine group, and the alkylthioxy group are the same as in the examples of the alkyl group described above. Specifically, the alkylthioxy group includes a methylthioxy group, an ethylthioxy group, a tert-butylthioxy group, a hexylthioxy group, or an octylthioxy group, but is not limited thereto.

In the present invention, the aryl group is not particularly limited, but the number of carbon atoms thereof is preferably 6 to 60, and the aryl group may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. The monocyclic aryl group may be a phenyl group, a biphenyl group, a terphenyl group, or the like, but is not limited thereto. The polycyclic aryl group may be a naphthyl group, an anthracenyl group, a phenanthryl group, a pyrenyl group, a perylenyl group, a chrycenyl group, a fluorenyl group, or the like, but is not limited thereto. The aryl group may be substituted or unsubstituted.

In the present invention, the aryl group in the monoaryl amine group, the diaryl amine group, the aryloxy group, and the arylthioxy group is the same as the examples of the aryl group described above. Specifically, the aryloxy group includes a phenoxy group, a p-tolyloxy group, a m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and the arylthioxy group includes a phenylthioxy group, a 2-methylphenylthioxy group, a 4-tert-butylphenyloxy group, and the like, but is not limited thereto.

In the present invention, the alkylene group is a divalent functional group derived from an alkane, for example, a straight-chain, branched, or cyclic group, and examples thereof may be a methylene group, an ethylene group, a propylene group, an isobutylene group, a sec-butylene group, a tert-butylene group, a pentylene group, a hexylene group, and the like. The alkylene group may be substituted or unsubstituted.

In the present invention, the arylene group means a matter where two bonding positions exist at the aryl group, that is, a divalent group. Excepting that the groups are each the divalent group, the aforementioned description of the aryl group may be applied. The arylene group may be substituted or unsubstituted.

In the present invention, a direct bond means being connected to a bond line where no atoms or atomic groups exist at the corresponding position.

I. Photoresist Composition (1) Acrylic Resin

The photoresist composition of one embodiment of the invention may include a (meth)acrylic resin containing a (meth)acrylic repeating unit and a functional group represented by Chemical Formula 1 bonded to the branched chain terminal of the repeating unit.

The (meth)acrylic repeating unit means a repeating unit that can be formed through polymerization of a (meth)acrylic monomer such as a (meth)acrylate or a (meth)acrylic acid.

In the photoresist composition, the (meth)acrylic resin can act as a resin which is dissociated by an acid to increase solubility in an alkali developing solution (hereinafter referred to as an alkali developable resin), and can simultaneously act as a corrosion inhibitor which can suppress a footing phenomenon at the lower end of the pattern during the pattern formation of the photoresist film.

This is due to the functional group represented by Chemical Formula 1 forming a chemical bond in the (meth)acrylic resin, which can exhibit completely different structures and effects from the blends of conventional (meth)acrylic resins and corrosion inhibitors.

Specifically, as the acid component generated from the photoacid generator upon exposure causes inactivation of acid at the surface of the copper substrate, electrons emitted while Cu changes to Cu+ meet H+ and oxygen and change to $H_2O$. In some cases, the photoresist on the Cu surface remains undeveloped.

As shown in Chemical Formula 1, the functional group of a triazole structure can suppress the reaction between the copper substrate and the acid component while substituting for the interaction with the surface of the copper substrate.

Consequently, in the photoresist composition, there are features that, since it is not necessary to mix a separate corrosion inhibitor with the alkali-soluble resin, problems occurring during addition of the corrosion inhibitor (for example, the productivity in manufacturing the resist composition is lowered, such as solubility of the corrosion inhibitor being poor, the corrosion inhibitor not being dissolved well or the stirring time being prolonged, and further the corrosion inhibitor contained in the resist pattern is dissolved in the plating solution in the process of plating after formation of the resist pattern, thereby contaminating the plating solution) are solved, and excellent developing sensitivity as an alkali developable resin can be realized.

That is, the photoresist composition may include a (meth)acrylic resin containing a (meth)acrylic repeating unit and a functional group represented by Chemical Formula 1 bonded to the branched chain terminal of the repeating unit. In addition, the photoresist composition may include an alkali-soluble resin including a (meth)acrylic repeating unit and a functional group represented by Chemical Formula 1 bonded to the branched chain terminal of the repeating unit.

In the (meth)acrylic repeating unit, the main chain may mean a polyethylene chain, and the branched chain may mean a side chain extending from the polyethylene chain.

Specifically, the branched chain may include a functional group represented by the following Chemical Formula 2.

[Chemical Formula 2]

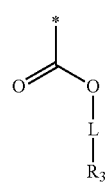

In Chemical Formula 2, $R_3$ is an alkyl group having 1 to 20 carbon atoms, or an aryl group having 6 to 30 carbon atoms, L is a direct bond, —O—, —CO—, —S—, —$SO_2$—, —$C(CH_3)_2$—, —$C(CF_3)_2$—, —CONH—, —COO—, —$(CH_2)_y$—, —$O(CH_2)_yO$—, —$\{(CH_2)_yO\}_p$—, —NH—, —$NH(CH_2)_y$—NH—, —$NH(CH_2)_yO$—, —$OCH_2$—$C(CH_3)_2$—$CH_2O$—, —COO—$(CH_2)_y$—OCO—, or —OCO—$(CH_2)_y$—COO—, and y and p in the L are each independently an integer of 1 to 10.

More preferably, in Chemical Formula 2, $R_3$ is a phenyl group, L is a direct bond or —$\{(CH_2)_yO\}p$-, and y and p are each independently an integer of 1 to 5.

In Chemical Formula 2, when L is —$\{(CH_2)_yO\}p$-, the terminal oxygen atom contained in the —$\{(CH_2)_yO\}p$- may be bonded to $R_3$ of Chemical Formula 2. More specific examples of the —$\{(CH_2)_yO\}p$- may include —$(CH_2)O$—, —$(CH_2)_2O$—, —$\{(CH_2)O\}_2$—, —$\{(CH_2)_2O\}_2$—, and the like.

It may be bonded to the main chain of the (meth)acrylic repeating unit through a moiety indicated by "*" in Chemical Formula 2.

When the length of the intermediate linker corresponding to L is increased in Chemical Formula 2, the interaction between the triazine-based functional group of Chemical Formula 1 acting as a corrosion inhibitor and the substrate becomes easier, and thus the sensitivity and resolution of the pattern obtained from the photoresist can be improved.

The one terminal of the branched chain may be a terminal located along the extending direction of the branch chain from the repeating unit. Therefore, the phrase "it is bonded to the branched chain terminal of the repeating unit" means that the functional group of Chemical Formula 1 is bonded to $R_3$ of Chemical Formula 2. In this case, it may be bonded to the $R_3$ of Chemical Formula 2 through a moiety indicated by "*" in Chemical Formula 1.

Meanwhile, the functional group represented by Chemical Formula 1 may include a triazole structure in the molecule to act as a corrosion inhibitor, and $R_1$ and $R_2$ are each independently hydrogen, a carboxyl group, a polyoxyalkylene-based functional group, an alkyl group having 1 to 20 carbon atoms, or an aryl group having 6 to 20 carbon atoms, or $R_1$ and $R_2$ may be connected to each other to form a cycloalkyl group having 3 to 20 carbon atoms.

The polyoxyalkylene-based functional group is a functional group containing a polyoxyalkylene unit in the functional group structure, and specifically, it can be represented by the following Chemical Formula 3.

[Chemical Formula 3]

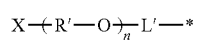

In Chemical Formula 3,

R' is an alkylene group having 1 to 5 carbon atoms,

X is hydrogen, deuterium, a halogen, a cyano group, a nitro group, a hydroxyl group, a carbonyl group, an ester group, an imide group, an amide group, an amino group, a carboxyl group, a sulfonic acid group, a sulfonamide group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an arylphosphine group, or a heterocyclic group containing at least one of N, O, and S atoms, L' is a direct bond, —O—, —CO—, —S—, —$SO_2$—, —$C(CH_3)_2$—, —$C(CF_3)_2$—, —CONH—, —COO—, —$(CH_2)_z$—, —$O(CH_2)_zO$—, —$O(CH_2)_z$—, —NH—, —$NH(CH_2)_z$—NH—, —$NH(CH_2)_zO$—, —$OCH_2$—$C(CH_3)_2$—$CH_2O$—, —COO—$(CH_2)_z$—OCO—, or —OCO—$(CH_2)_z$—COO—, and z in the L' is an integer of 1 to 10.

Preferably, in Chemical Formula 3, R is an alkylene group having 1 to 3 carbon atoms, X is a carboxyl group, and L' may be —$C(CH_3)_2$—.

Further, in Chemical Formula 1, $R_1$ and $R_2$ may be connected to each other to form a cycloalkyl group having 7 to 10 carbon atoms, preferably a cycloalkyl group having 8 carbon atoms.

Meanwhile, the (meth)acrylic repeating unit may be a structure represented by the following Chemical Formula 4. The repeating unit represented by Chemical Formula 4 includes a main chain and a branched chain contained in the (meth)acrylic resin, and the functional group represented by Chemical Formula 1 may be bonded to the branched chain terminal of the repeating unit represented by Chemical Formula 4.

[Chemical Formula 4]

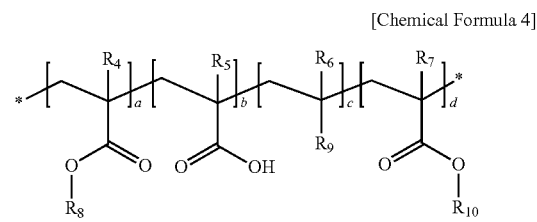

In Chemical Formula 4, $R_4$ to $R_7$ are each independently hydrogen or a methyl group, $R_8$ is an alkyl group having 4 to 10 carbon atoms, $R_9$ is a functional group represented by Chemical Formula 2, $R_{10}$ is a cycloalkyl group having 3 to 20 carbon atoms, and a molar ratio of a:b:c:d is 3 to 6:0.5 to 2:2 to 5:1 to 5.

The cycloalkyl group having 3 to 20 carbon atoms is specifically a polycyclic cycloalkyl group, and may include a norbornane-based functional group. More specifically, the norbornane-based functional group may include a structure in which two adjacent substituents included in norbonane are bonded to each other to form a cycloalkyl group, and one hydrogen included in the norbornane is substituted with a direct bond.

Specifically, $R_{10}$ may be a polycyclic cycloalkyl group represented by the following Chemical Formula 6.

[Chemical Formula 6]

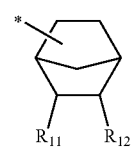

In Chemical Formula 6, $R_{11}$ and $R_{12}$ are each independently hydrogen, an alkyl group having 1 to 20 carbon atoms, or an aryl group having 6 to 20 carbon atoms, or $R_{11}$ and $R_{12}$ may be connected to each other to form a cycloalkyl group having 3 to 20 carbon atoms. Preferably, it may be a functional group of the following Chemical Formula 6-1 in which $R_{11}$ to $R_{12}$ are linked to each other to form a cycloalkyl group having 5 carbon atoms.

[Chemical Formula 6-1]

More specifically, in Chemical Formula 3, $R_8$ is a tert-butyl group, $R_{10}$ is a functional group represented by Chemical Formula 6-1, $R_4$ to $R_7$ are each independently a methyl group, and a molar ratio of a:b:c:d is 3 to 6:0.5 to 2:2 to 5:1 to 5.

As a non-limiting example, the (meth)acrylic resin may be contained in an amount of 30 to 60% by weight of a repeating unit having a functional group dissociated by an acid in the molecule, which may be preferable for forming a stable pattern. Examples of the repeating unit having a functional group dissociated by an acid in the molecule may include repeating units represented by Chemical Formula 3 where the branched chain terminal is represented by $R_8$.

For the purpose of preventing wettability with a plating solution or a developing solution, adhesion to a substrate, and occurrence of cracks, the (meth)acrylic resin may preferably include 10 to 50% by weight of a repeating unit having a triazole functional group. Examples of the repeating unit having a triazole functional group include a repeating unit of Chemical Formula 3 where the branched chain terminal is represented by $R_9$.

In order to prevent cracking or swelling in the photoresist pattern during plating, the (meth)acrylic resin preferably contains 10 to 50% by weight of a hydrophobic bulky repeat unit capable of imparting plating resistance. Examples of the hydrophobic bulky repeat unit include repeating units of Chemical Formula 3 where the branched chain terminal is represented by $R_{10}$.

In addition, in the formation of the (meth)acrylic resin, a repeating unit having an acidic group or a hydroxyl group can be applied in an amount of 5 to 20% by weight, thereby controlling the sensitivity and the developing speed. As such a repeating unit, a compound in a form that is protected with a group deprotected by an acid is also applicable. Examples of the repeating unit having an acidic group or a hydroxyl group may include a repeating unit of Chemical Formula 3 in which the branched chain terminal is a carboxyl group.

In addition, in the formation of the (meth)acrylic resin, the repeating units capable of controlling heat resistance and chemical resistance properties can be added.

Specifically, the (meth)acrylic resin may be a polymer represented by the following Chemical Formula 5.

[Chemical Formula 5]

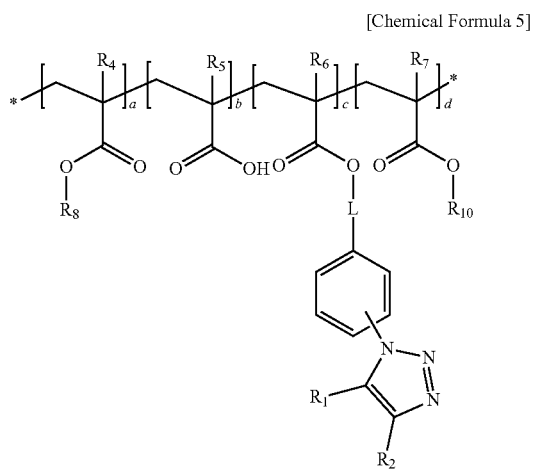

In Chemical Formula 5, $R_1$ and $R_2$ are each independently hydrogen, a carboxy group, a polyoxyalkylene-based functional group, an alkyl group having 1 to 20 carbon atoms, or an aryl group having 6 to 20 carbon atoms, or $R_1$ and $R_2$ may be connected to each other to form a cycloalkyl group having 3 to 20 carbon atoms, $R_4$ to $R_7$ are each independently hydrogen or a methyl group, $R_8$ is an alkyl group having 4 to 10 carbon atoms, $R_{10}$ is a cycloalkyl group having 3 to 20 carbon atoms, a molar ratio of a:b:c:d is 3 to 6:0.5 to 2:2 to 5:1 to 5, L is a direct bond, —O—, —CO—, —S—, —SO$_2$—, —C(CH$_3$)$_2$—, —C(CF$_3$)$_2$—, —CONH—, —COO—, —(CH$_2$)$_y$—, —O(CH$_2$)$_y$O—, —{(CH$_2$)$_y$O}$_p$—, —NH—, —NH(CH$_2$)$_y$—NH—, —NH(CH$_2$)$_y$O—, —OCH$_2$—C(CH$_3$)$_2$—CH$_2$O—, —OCO—(CH$_2$)$_y$—OCO—, or —OCO—(CH$_2$)$_y$—COO—, and y and p in the L are each independently an integer of 1 to 10.

More preferably, in Chemical Formula 5, L is a direct bond or —{(CH$_2$)$_y$O}$_p$—, and y and p are each independently an integer of 1 to 5.

In Chemical Formula 5, when L is —{(CH$_2$)$_y$O}$_p$—, the terminal oxygen atom contained in the —{(CH$_2$)$_y$}$_p$— may be bonded to the benzene ring of Chemical Formula 5. More specific examples of the —{(CH$_2$)$_y$O}$_p$— may include —(CH$_2$)O—, —(CH$_2$)$_2$O—, —{(CH$_2$)O}$_2$—, —{(CH$_2$)$_2$)$_2$O}$_2$—, and the like.

Specific examples of the polymer represented by Chemical Formula 5 may include a compound C-1 of Synthesis Example 1, a compound C-2 of Synthesis Example 2, a compound C-3 of Synthesis Example 3, a compound C-4 of Synthesis Example 4, a compound C-5 of Synthesis Example 5, a compound C-6 of Synthesis Example 6, and the like.

Examples of the method of synthesizing the (meth)acrylic resin are not limited, but a method of synthesizing a (meth)acrylic polymer using a monomer mixture containing a (meth)acrylic monomer in which a halogen atom is substituted at the terminal thereof, substituting the halogen atom with an azide group through a nucleophilic aromatic substitution reaction, and then click reacting with a compound containing an alkane functional group, can be used.

The (meth)acrylic resin may have a weight average molecular weight of 10,000 g/mol to 300,000 g/mol, 10,000 g/mol to 250,000 g/mol, or 12,000 g/mol to 200,000 g/mol, which is advantageous for forming a stable pattern.

(2) Photoresist Composition

The photoresist composition of one embodiment of the invention may specifically be a positive type of photoresist composition for a thick film.

The photoresist composition of the embodiment may include, in addition to the (meth)acrylic resin, a polymer resin having an acid group protected by a protecting group, which may act as an alkali-developable resin. The acid group may be, for example, a carboxyl group, a phenolic hydroxyl group, or the like. As the alkali-developable resin, a polymer resin commonly known in the art can be used, and for example, it may be a hydroxystyrene resin or the like.

Preferably, the hydroxystyrene resin may be further included in an amount of 1 to 90 parts by weight, 10 to 50 parts by weight, or 10 to 30 parts by weight, based on 100 parts by weight of the (meth)acryl resin.

Preferably, the hydroxystyrene resin may have a weight average molecular weight of 5000 g/mol to 20,000 g/mol. Specifically, the hydroxystyrene resin may be substituted with a protecting group containing an acetal group or a tert-butyloxycarbonyl group (t-boc). More specifically, the hydroxystyrene resin may include a hydroxystyrene resin substituted with an acetal group or a hydroxystyrene resin substituted with a tert-butyloxycarbonyl (t-boc).

In this case, 20% to 60%, 30% to 50%, or 35% to 45% of the total hydroxyl groups may be substituted with a protecting group. The unit of "%" may specifically be "mol %", and the kind of the protecting group is not particularly limited. Various functional groups known as a protecting group for the hydroxyl group can be used, and preferably, an acetal group or a tert-butyloxycarbonyl group (t-boc) can be used.

The photoresist composition may further include various organic solvents or other additives that are widely known in the field of the photoresist, if necessary.

The organic solvent is included to uniformly dissolve and mix various components, and to control the viscosity of the photoresist composition. The organic solvent may be applied without particular limitation as long as it is known to be usable in a positive type of photoresist composition.

For example, the organic solvent may be at least one compound selected from the group consisting of ethylene glycol monomethyl ether, ethylene glycol monoethyl ether, ethylene glycol monomethyl ether, ethylene glycol monoacetate, diethylene glycol, diethylene glycol monoethyl ether, diethylene glycol methyl ethyl ether, propylene glycol, propylene glycol monoacetate, propylene glycol methyl ether acetate, toluene, xylene, methyl ethyl ketone, methyl isoamyl ketone, cyclohexanone, dioxane, methyl lactate, ethyl lactate, methyl pyruvate, ethyl pyruvate, methyl methoxy propionate, ethyl ethoxy propionate, N,N-dimethylformamide, N,N-dimethylacetamide, N-methyl-2-pyrrolidone, 3-ethoxyethyl propionate, 2-heptanone, gamma-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxy-2-methylpropionate, ethyl 3-ethoxypropionate, ethyl 3-methoxy-2-methylpropionate, ethyl acetate, butyl acetate, and the like.

The organic solvent may be used in an amount of 5 to 500 parts by weight, 5 to 450 parts by weight, or 5 to 400 parts by weight, based on 100 parts by weight of the total amount of the resin components (the (meth)acrylic resin and the other alkali-soluble resin). In other words, in order to ensure the applicability of the composition, the organic solvent is preferably contained in an amount of 5 parts by weight or more based on 100 parts by weight of the total amount of the resin component. However, when the organic solvent is added in an excess amount, the viscosity of the composition may be lowered and it may be difficult to adjust the thickness of the photoresist. Therefore, it is preferable that the organic solvent is included in an amount of 500 parts by weight or less based on 100 parts by weight of the total amount of the resin component.

Examples of the other additives may include a photoacid generator, an acid diffusion control agent, a plasticizer, a surfactant, a photoinitiator, a dissolution inhibitor, and the like. However, in the photoresist composition of the embodiment, as the first (meth)acrylic resin and the second (meth)acrylic resin are used in combination as described above, a separate corrosion inhibitor may not be used.

That is, the photoresist composition may contain less than 0.0001% by weight of a corrosion inhibitor including a triazine thiol compound or a triazole compound. The "less than 0.0001% by weight" means that the photoresist composition does not contain any corrosion inhibitor or contains it in a trace amount so as to not act as a corrosion inhibitor.

The photoacid generator, the acid diffusion control agent, the plasticizer, the surfactant, the photoinitiator, and the dissolution inhibitor may be applied without particular limitation as long as they can be commonly used for positive photoresist compositions in the technical field to which the present invention pertains.

The photoinitiator may be benzophenone, aromatic alpha-hydroxy ketone, benzyl ketal, aromatic alpha-amino ketone, phenylglyoxalic acid ester, mono-acylphosphine oxide, bis-acylphosphine oxide, tris-acylphosphine oxide, aromatic ketone-derived oxime ester, carbazole-based oxime ester, and the like.

The photoinitiator may be contained in an amount of 0.1 to 5 parts by weight based on 100 parts by weight of the total amount of the resin component, which is advantageous for expressing an appropriate effect of the photoinitiator.

The photoacid generator may be contained in an amount of 0.1 to 10 parts by weight, or 0.5 to 10 parts by weight, or 1 to 5 parts by weight based on 100 parts by weight of the total amount of the resin component.

That is, in order to sufficiently express the above-described photoacid generating effect, the photoacid generator is preferably contained in an amount of 0.1 parts by weight or more based on 100 parts by weight of the total amount of the resin component. However, when the photoacid generator is added in an excess amount, the photosensitivity of the composition may deviate from an appropriate level, and scum may remain in the exposed part after development. Therefore, it is preferable that the photoacid generator is contained in an amount of 10 parts by weight or less based on 100 parts by weight of the total amount of the resin component.

The surfactant may be contained in an amount of 0.01 to 1 part by weight, 0.05 to 1 part by weight, or 0.05 to 0.5 parts by weight based on 100 parts by weight of the total amount of the resin component. When the surfactant is added in an excess amount, the wettability and flatness of the composition with respect to the substrate may deviate from an appropriate level. Therefore, the surfactant is preferably contained in an amount of 1 part by weight or less based on 100 parts by weight of the total amount of the resin component.

The acid diffusion control agent may be included for improving the resist pattern shape, stability after exposure, etc., and for example, it may be at least one selected from the group consisting of triethylamine, tripropyl amine, tribenzyl amine, trihydroxyethyl amine, and ethylene diamine.

II. Photoresist Film

On the other hand, according to another embodiment of the present invention, the ratio of the footing length to the photoresist film thickness is 0.05 or less, 0.001 to 0.05, 0.005 to 0.02, or 0.008 to 0.016. The ratio of the footing length to the photoresist film thickness means a value obtained by dividing the footing length (unit: μm) by photoresist film thickness (unit: μm).

As a method of measuring a photoresist film thickness, various methods that are widely known in the field of films can be used, and various known methods can be applied without limitation.

The footing length can be measured as the value of a difference between a hole diameter at an upper end of the resist pattern contained in the photoresist film and a hole diameter at a lower end thereof. The hole diameter at the end of the pattern may mean the maximum diameter of a cross-section taken in a direction parallel to the support with respect to the via hole formed at the upper or lower end of the pattern, and the diameter of the cross-section can be measured through a SEM image. The lower end of the pattern means a point where the photoresist pattern is in contact with the support having the metal surface, and the upper end of the pattern may mean a point of the photoresist pattern farthest away from the support having the metal surface.

If the ratio of the footing length to the photoresist film thickness is excessively increased to more than 0.05, there is a limitation that it is difficult to form a resist pattern suitable for bump formation due to excessive occurrence of the footing phenomenon at the lower end of the pattern.

More specifically, when there is almost no difference between the hole diameter at the upper end of the photoresist pattern and the hole diameter at the lower end thereof as shown in FIG. 1, it means that the footing length is 1 µm or less and the footing phenomenon is minimized, and in this case, it can satisfy the condition that the ratio of the footing length to photoresist film thickness is 0.05 or less.

For example, the footing length can be measured as follows. The photoresist composition of one embodiment of the invention is spin-coated onto a substrate having a metal surface so that the film thickness is 30 µm, dried on a hot plate at 110° C. for 2 minutes, exposed to light at 250 mJ/cm$^2$ using an i-line irradiation device (equipped with a photomask in which a hole pattern with a size of about 10, 20, 30, 40, and 50 µm is formed), additionally baked with a hot plate at 90° C. for 2 minutes, and developed in an about 2.38 wt % tetramethylammonium hydroxide (TMAH) aqueous solution for 3 minutes. The footing length is measured using the value of the difference between the hole diameter at the upper end of the resist pattern thus produced and the hole diameter at the lower end thereof.

On the other hand, as shown in FIG. 2, the footing length, which is the difference between the hole diameter at the upper end of the photoresist pattern and the hole diameter at the lower end thereof, is more than 1 µm, which means that the footing phenomenon sufficiently occurs. In this case, the ratio of the footing length to the photoresist film thickness may appear to be greater than 0.05.

The photoresist film may include a cured product of the photoresist composition of one embodiment.

More specifically, the photoresist film can be obtained by a method for preparing a photoresist film including the steps of applying and drying the photoresist composition of one embodiment, and then exposing and developing the photoresist composition to form a photoresist film.

As a more specific example, a method for preparing the photoresist film is as follows. The photoresist composition of one embodiment of the invention is spin-coated onto a substrate having a metal surface and dried at 110° C. for 2 minutes to form a photoresist layer having a thickness of about 10 µm. Subsequently, the substrate is exposed to light using an i-line irradiation device (equipped with a photomask in which a hole pattern with a size of about 10, 20, 30, 40, and 50 µm is formed). The exposed substrate is dried at 90° C. for 2 minutes, and the substrate is developed using a developing solution (an about 2.38 wt % tetramethylammonium hydroxide aqueous solution) for 1 minute.

The support having a metal surface may include a substrate having a metal layer formed on its surface, or a metal substrate. In the substrate having the metal layer formed on the surface thereof, examples of the substrate are not particularly limited, and various materials commonly known in the field of photoresist patterning, such as plastics, woods, and semiconductor materials such as wafers, metals, and the like can be applied without limitation.

The photoresist film of the other embodiment minimizes the scum that remains on the pattern during pattern formation, and has strong resistance by the plating solution during the plating process, thereby preventing deformation of the pattern.

ADVANTAGEOUS EFFECTS

According to the present invention, a photoresist composition capable of realizing excellent pattern performance during formation of fine patterns, and of preparing a photoresist film that is excellent in chemical stability of a plating solution, and a photoresist film using the same, can be provided.

BRIEF DESCRIPTION OF THE DRAWINGS

FIG. 1 shows a SEM image of measurement of the footing length and scum of the photoresist pattern obtained in Example 1.

FIG. 2 shows a SEM image of measurement of the footing length and scum of the photoresist pattern obtained in Comparative Example 1.

DETAILED DESCRIPTION OF THE EMBODIMENTS

The invention will be described in more detail by way of the following examples. However, the following examples are given for illustrative purposes only, and the scope of the present invention is not intended to be limited by the following examples.

Synthesis Example: Synthesis of Acrylic Resin

Synthesis Example 1

The weight ratio of tert-butyl methacrylate, methacrylic acid, (4-bromo)phenylmethacrylate, and 5-methacryloyloxy-2,3-trimethylenenorbornane was set to be 40/10/30/20, and a total amount (500 g) of acrylate monomers and 500 g of PGMEA were stirred. After the temperature was increased to 80° C., 5 g of AIBN (Azobisisobutyronitrile) was added thereto, and stirred for 12 hours while the temperature was maintained to synthesize an acrylic polymer represented by the following Chemical Formula A-1.

A compound A'-1 was obtained by nucleophilic aromatic substitution reaction of the compound A-1 and the compound NaN$_3$ as shown in Reaction Scheme 1-1 below.

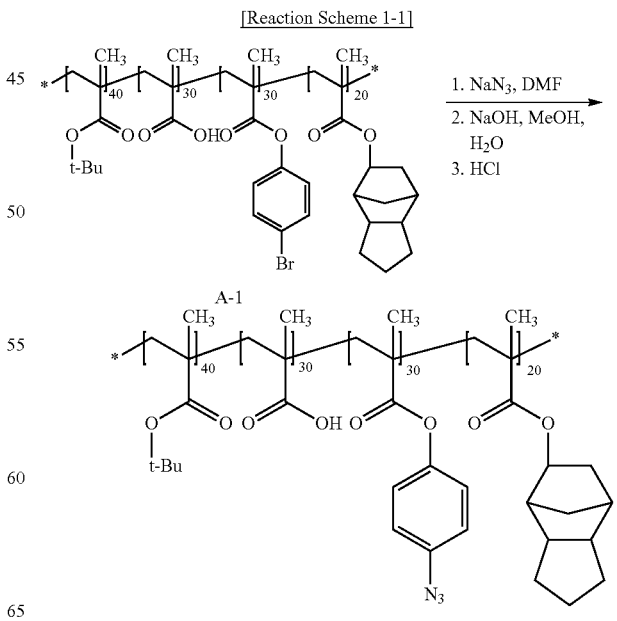

A compound C-1 was obtained by a click reaction of the compound A'-1 and the compound B-1 as shown in Reaction Scheme 1-2 below. Specifically, the compound A'-1 and the compound B-1 were respectively dissolved in chloroform in an amount of 1.0 equiv. A catalyst solution (CuBr/PMDETA=1/1 mol/mol)(PMDETA:N,N,N',N'',N-pentamethyl diethylene triamine) previously prepared was added in an amount of 0.05 equiv. based on CuBr at room temperature, and the mixture was stirred for 12 hours. The reaction solution was washed with water and HCl (1 N), and then the organic layer was concentrated and purified by column chromatography to obtain 21 g of a compound C-1 (yield: 60%).

[Reaction Scheme 1-2]

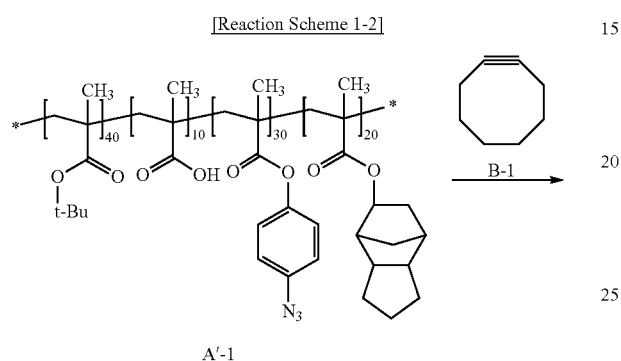

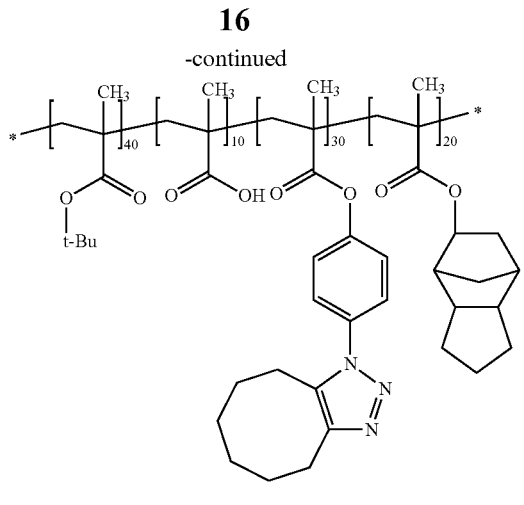

C-1

Synthesis Example 2

A compound C-2 (yield: 60%) was obtained in the same manner as in Synthesis Example 1, except that the compound B-2 was used instead of the compound B-1 as shown in the following Reaction Scheme 1-3.

[Reaction Scheme 1-3]

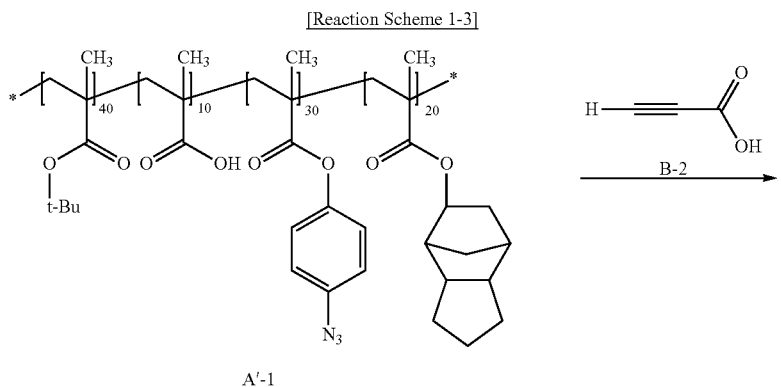

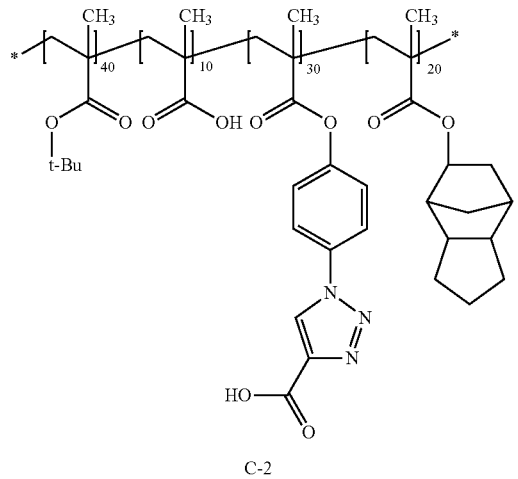

C-2

Synthesis Example 3

A compound C-3 (yield: 60%) was obtained in the same manner as in Synthesis Example 1, except that the compound B-3 was used instead of the compound B-1 as shown in the following Reaction Scheme 1-4.

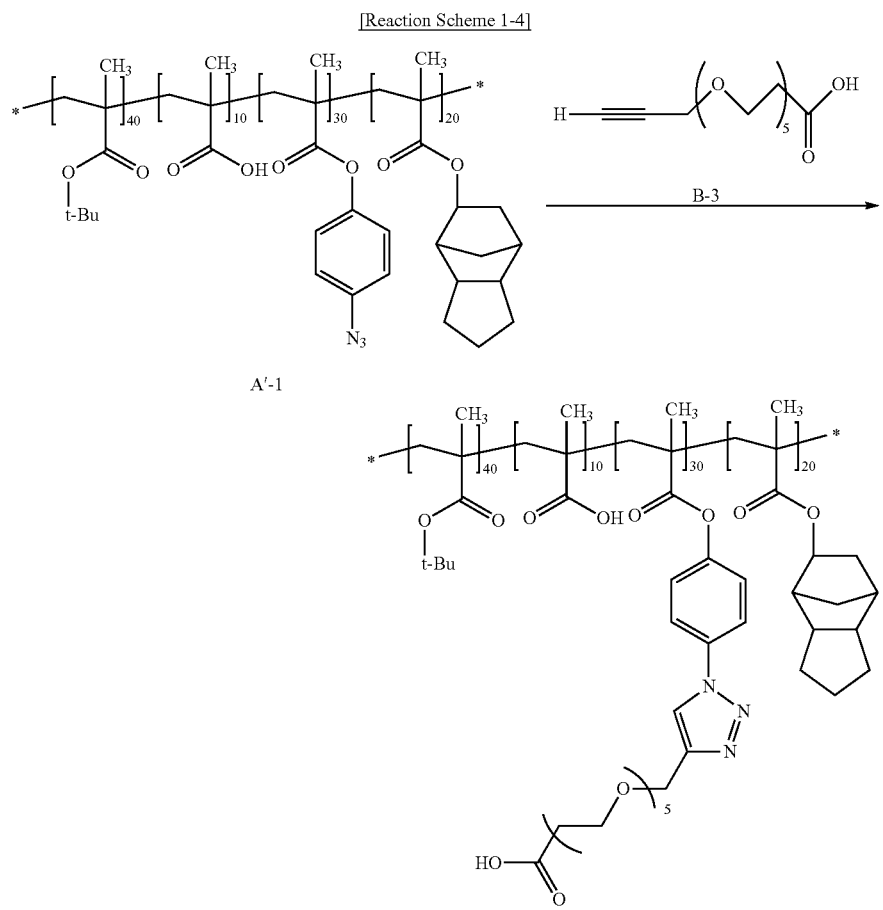

Synthesis Example 4

A compound C-4 (yield: 60%) was obtained in the same manner as in Synthesis Example 1, except that a compound A-2 prepared by using (4-bromophenoxymethyl) methacrylate instead of (4-bromo)phenyl methacrylate was used as shown in the following Reaction Schemes 1-5 and 1-6.

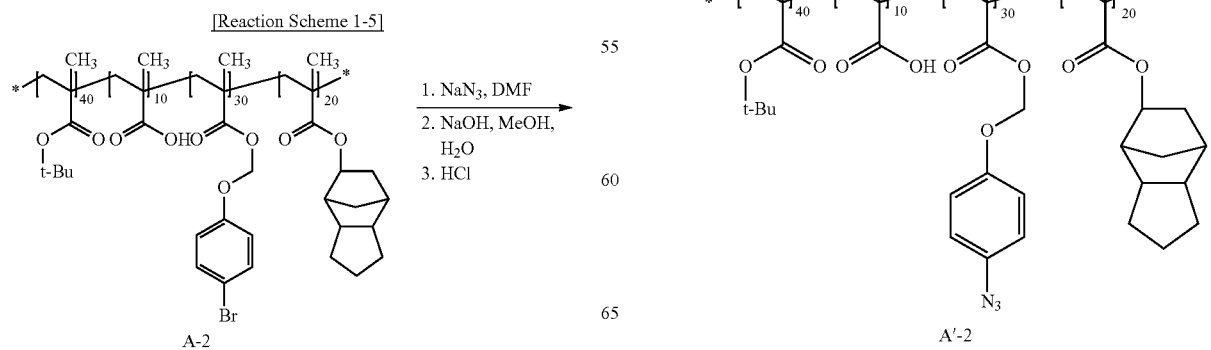

[Reaction Scheme 1-6]
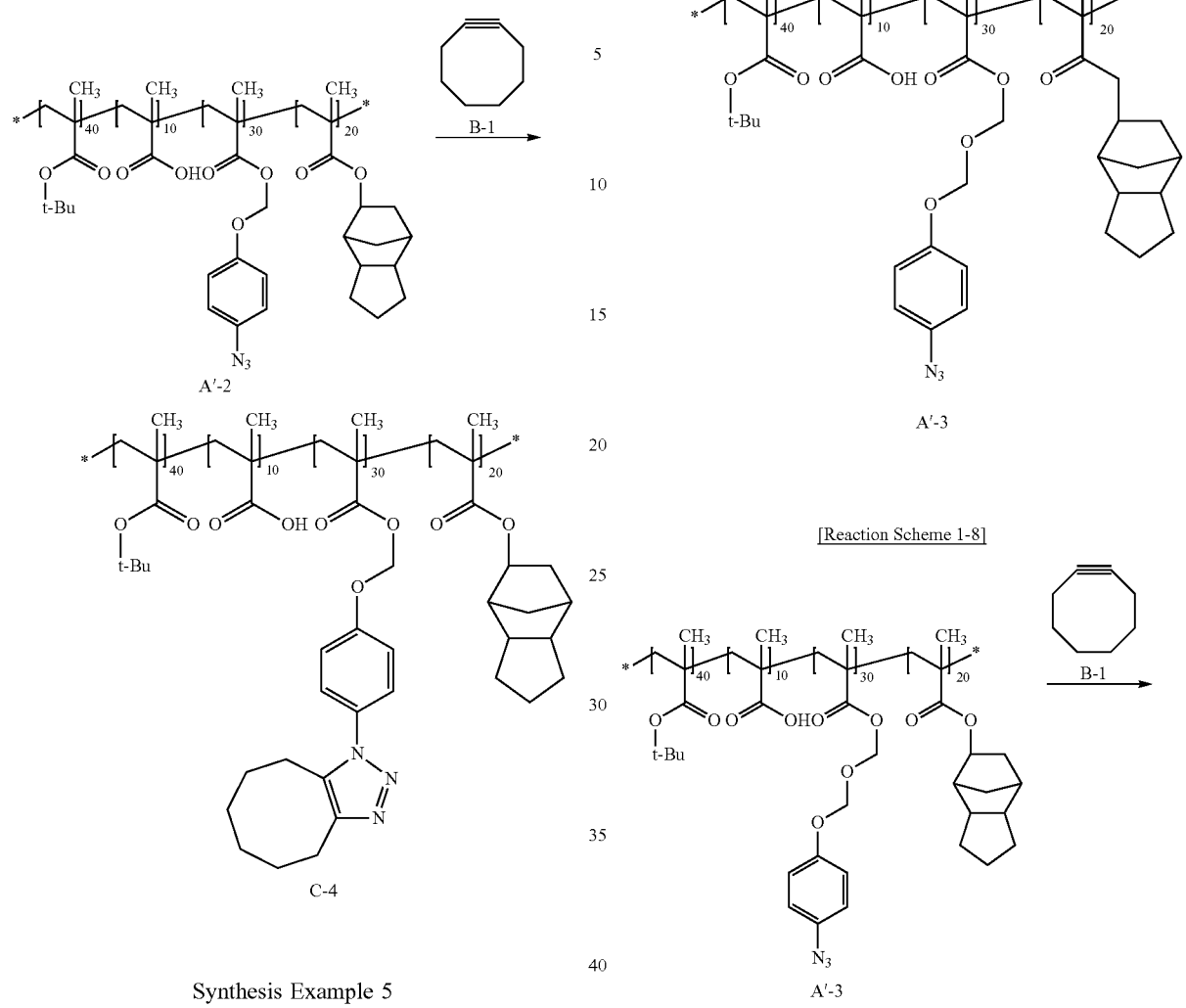
Synthesis Example 5
A compound C-5 (yield: 60%) was obtained in the same manner as in Synthesis Example 1, except that a compound A-3 prepared by using ((4-bromophenoxy)methoxy)methyl methacrylate instead of the (4-bromo)phenyl methacrylate was used as shown in the following Reaction Schemes 1-7 and 1-8.
[Reaction Scheme 1-7]
[Reaction Scheme 1-8]
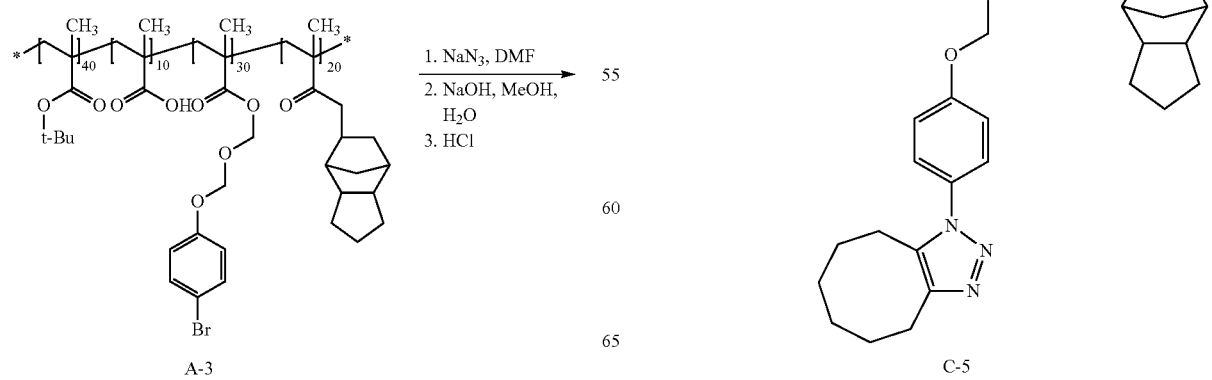

Synthesis Example 6

A compound C-6 (yield: 60%) was obtained in the same manner as in Synthesis Example 1, except that a compound A-4 prepared by using ((4-bromophenoxy)ethoxy)ethyl methacrylate instead of the (4-bromo)phenyl methacrylate was used as shown in the following Reaction Schemes 1-9 and 1-10.

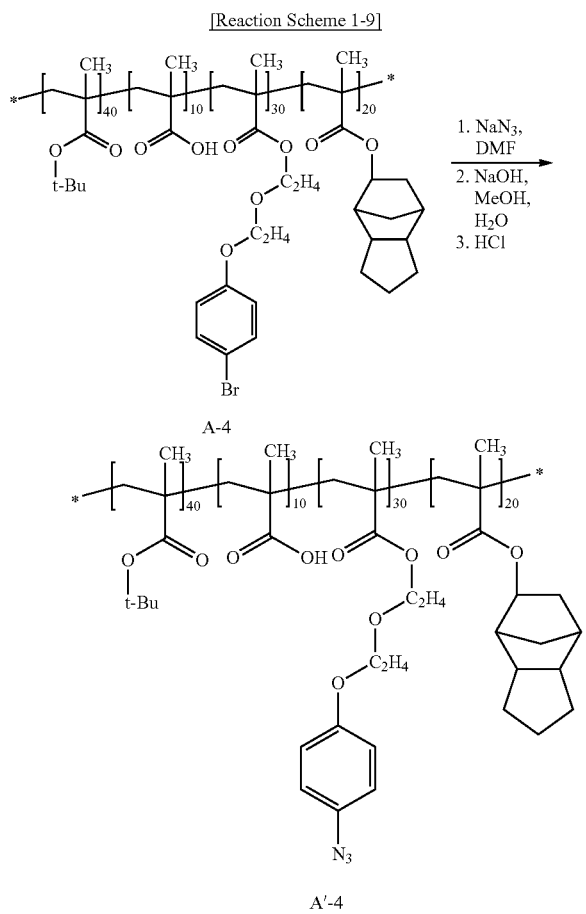

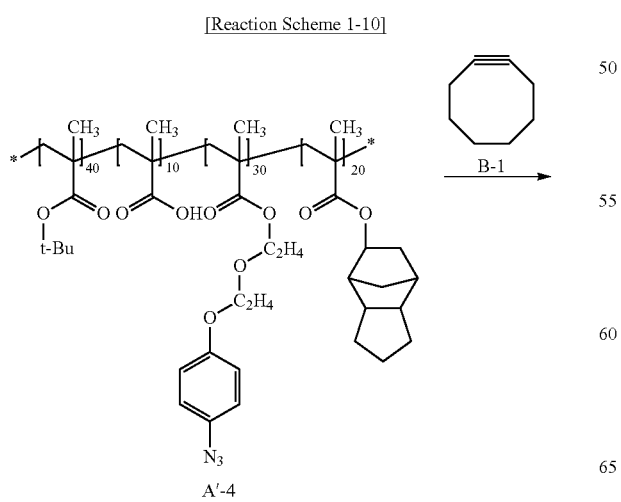

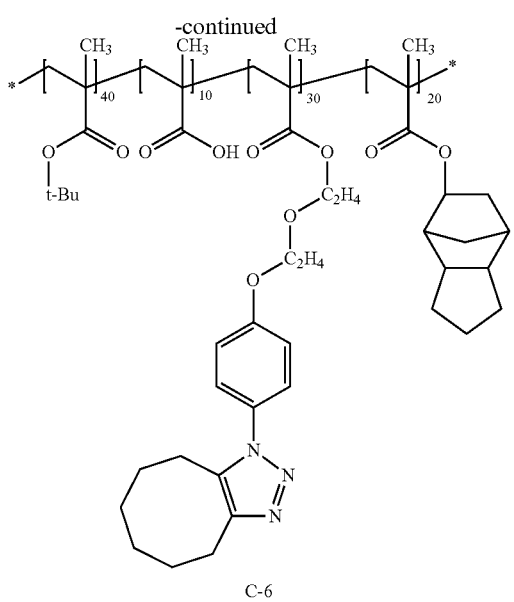

Comparative Synthesis Example 1

The weight ratio of tert-butyl methacrylate, methacrylic acid, (2-methoxyethoxy)ethylmethacrylate, and 5-methacryloyloxy-2,3-trimethylenenorbornane was set to be 40/10/30/20, and total amount (500 g) of acrylate monomers and 500 g of PGMEA were stirred. After the temperature was increased to 80° C., 5 g of AIBN was added thereto, stirred for 12 hours, and the temperature were maintained to synthesize an acrylic polymer represented by the following Chemical Formula A-5.

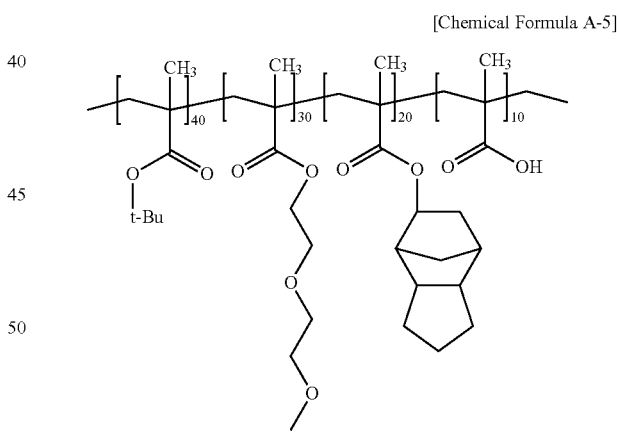

Examples and Comparative Examples: Preparation of Photoresist Composition

The components shown in Table 1 below were mixed to prepare photoresist compositions of examples and comparative examples, respectively.

Specifically, the components used in Table 1 are as follows.

Other resin:
1) Acetal protected polyhydroxystyrene (PHS-Acetal) resin (Mw 15,300 g/mol, substitution rate: 40%)

2) t-boc protected polyhydroxystyrene (PHS-t-boc) resin (Mw: 14,800 g/mol, substitution rate: 40%)
Organic solvent: Propylene glycol methyl ether acetate (PGMEA)
Photoacid generator: NAI-105 (manufactured by Midori Kagaku Co., Ltd.)
Corrosion inhibitor: benzotriazole (BTA)

TABLE 1

| Category (unit: g) | Acrylic resin Type | Addtion amount | Other resin | Photoacid generator | Corrosion inhibitor | Organic solvent |
|---|---|---|---|---|---|---|
| Example 1 | Synthesis Example 1 | 120 | 15 (PHS-Acetal) | 1 | — | 40 |
| Example 2 | Synthesis Example 2 | 120 | 15 (PHS-Acetal) | 1 | — | 40 |
| Example 3 | Synthesis Example 3 | 120 | 15 (PHS-Acetal) | 1 | — | 40 |
| Example 4 | Synthesis Example 4 | 120 | 15 (PHS-Acetal) | 1 | — | 40 |
| Example 5 | Synthesis Example 5 | 120 | 15 (PHS-Acetal) | 1 | — | 40 |
| Example 6 | Synthesis Example 6 | 120 | 15 (PHS-Acetal) | 1 | — | 40 |
| Example 7 | Synthesis Example 2 | 120 | 15 (PHS-t-boc) | 1 | — | 40 |
| Comparative Example 1 | Comparative Synthesis Example 1 | 120 | 15 (PHS-Acetal) | 1 | 0.3 | 40 |

Experimental Example

The physical properties of the photoresist composition were evaluated by the following methods using the respective photoresist compositions according to the examples and comparative examples, and the results are shown in Table 2 below.

(1) Whether Scum Remained

The photoresist composition prepared in the examples and comparative examples were spin-coated onto a copper (Cu) substrate having a metal surface so that the film thickness was 10 μm, dried on a hot plate at 110° C. for 2 minutes, exposed to light at 250 mJ/cm² using an i-line irradiation device (equipped with a photomask in which a hole pattern with a size of about 10, 20, 30, 40, and 50 μm is formed), additionally dried with a hot plate at 90° C. for 2 minutes, and developed in an about 2.38 wt % tetramethylammonium hydroxide (TMAH) aqueous solution for 1 minute to prepare a resist pattern.

The surface of the resist pattern was analyzed by FE-SEM (Hitachi, S-4800) equipment to determine whether or not scum was detected. Whether scum remained was evaluated based on the following criteria.
Good: Scum not detected
Defective: Scum detected In addition, scum measurement results (FE-SEM (Hitachi, S-4800)) of Example 1 are shown in FIG. 1 and scum measurement results (FE-SEM (Hitachi, S-4800)) of Comparative Example 1 are shown in FIG. 2.

(2) Footing at Lower End of the Pattern

The photoresist composition prepared in the examples and comparative examples were spin-coated onto a copper (Cu) substrate having a metal surface so that the film thickness is 30 μm, dried on a hot plate at 110° C. for 2 minutes, exposed to light at 250 mJ/cm² using an i-line irradiation device (equipped with a photomask in which a hole pattern with a size of about 10, 20, 30, 40, and 50 μm is formed), additionally baked with a hot plate at 90° C. for 2 minutes, and developed in an about 2.38 wt % tetramethylammonium hydroxide (TMAH) aqueous solution for 3 minutes to prepare a resist pattern.

The footing length was measured using the value of the difference between the hole diameter at the top of the resist pattern and the hole diameter at the bottom thereof. Using this, the footing length relative to the pattern thickness (footing length/pattern thickness) was obtained and the footing characteristics were evaluated.

In addition, the results of measurement of the footing length (FE-SEM (Hitachi, S-4800)) of Example 1 are shown in FIG. 1, and the results of measurement of the footing length (FE-SEM (Hitachi, S-4800)) of Comparative Example 1 are shown in FIG. 2.

(3) Resistance to Plating Solution

After the resist pattern prepared in Experimental Example 1 was immersed in a SnAg plating solution for 2 hours, the surface of the resist pattern was analyzed by FE-SEM (Hitachi, S-4800) equipment. The resistance to the plating solution was evaluated based on the presence or absence of deformation of the resist pattern.
Good: Absence of deformation of resist pattern
Defective: Presence of deformation of resist pattern

TABLE 2

| | Whether Scum remained | Footing length/ pattern thickness | Plating solution resistance |
|---|---|---|---|
| Example 1 | Good | 0.008 | Good |
| Example 2 | Good | 0.016 | Good |
| Example 3 | Good | 0.012 | Good |
| Example 4 | Good | 0.008 | Good |
| Example 5 | Good | 0.014 | Good |
| Example 6 | Good | 0.013 | Good |
| Example 7 | Good | 0.015 | Good |
| Comparative Example 1 | Defective | 0.059 | Defective |

Referring to Table 2, it was confirmed that in the case of the photoresist composition according to the examples, pattern deformation did not occur even for the plating solution since no corrosion inhibitor was contained as an additive in the composition even while scum or footing at the lower end of the pattern was hardly generated after pattern formation.

On the other hand, it was confirmed that in the case of the photoresist composition of Comparative Example 1, as the corrosion inhibitor was added to the composition separately from the resin, it was difficult to form a resist pattern suitable for bump formation due to an increase in the footing length as well as the occurrence of scum after pattern formation, and the pattern deformation occurred by the plating solution during the plating process.

The invention claimed is:

1. A photoresist composition comprising a photoacid generator, and a (meth)acrylic resin containing a (meth)acrylic repeating unit and a functional group represented by Chemical Formula 1 bonded to a terminal of a branched chain in the repeating unit:

[Chemical Formula 1]

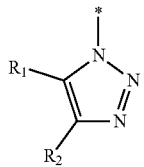

wherein, in the Chemical Formula 1,
$R_1$ and $R_2$ are each independently hydrogen, a carboxyl group, a polyoxyalkylene-based functional group, an alkyl group having 1 to 20 carbon atoms, or an aryl group having 6 to 20 carbon atoms, or $R_1$ and $R_2$ form a cycloalkyl group having 3 to 20 carbon atoms,
wherein the branched chain includes a functional group represented by Chemical Formula 2:

[Chemical Formula 2]

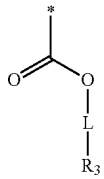

wherein, in the Chemical Formula 2,
$R_3$ is an alkyl group having 1 to 20 carbon atoms, or an aryl group having 6 to 30 carbon atoms,
L is a direct bond, —O—, —CO—, —S—, —$SO_2$—, —$C(CH_3)_2$—, —$C(CF_3)_2$—, —CONH—, —COO—, —$(CH_2)_y$—, —$O(CH_2)_yO$—, —$\{(CH_2)_yO\}_p$—, —NH—, —$NH(CH_2)_y$—NH—, —$NH(CH_2)_y$—O—, —$OCH_2$—$C(CH_3)_2$—$CH_2O$—, —COO—$(CH_2)_y$—OCO—, or —OCO—$(CH_2)_y$—COO—, and
y and p are each independently an integer of 1 to 10
wherein the functional group of Chemical Formula 1 is bonded to $R_3$ of the Chemical Formula 2, and
wherein the (meth)acrylic repeating unit is represented by Chemical Formula 4:

[Chemical Formula 4]

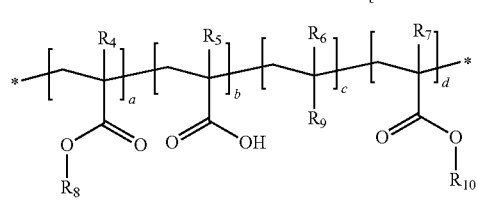

wherein, in Chemical Formula 4,
$R_4$ to $R_7$ are each independently hydrogen or a methyl group,
$R_8$ is an alkyl group having 4 to 10 carbon atoms which can be deprotected by an acid,
$R_9$ is the functional group represented by the Chemical Formula 2,
$R_{10}$ is a cycloalkyl group having 3 to 20 carbon atoms, and
a molar ratio of a:b:c:d is 3 to 6:0.5 to 2:2 to 5:1 to 5.

2. The photoresist composition according to claim 1, wherein, in the Chemical Formula 2, $R_3$ is a phenyl group, L is a direct bond or —$\{(CH_2)_yO\}_p$—, and y and p are each independently an integer of 1 to 5.

3. The photoresist composition according to claim 1, wherein the polyoxyalkylene-based functional group is a functional group represented by Chemical Formula 3:

[Chemical Formula 3]

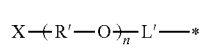

wherein, in the Chemical Formula 3,
R' is an alkylene group having 1 to 5 carbon atoms,
X is hydrogen, deuterium, a halogen, a cyano group, a nitro group, a hydroxyl group, a carbonyl group, an ester group, an imide group, an amide group, an amino group, a carboxyl group, a sulfonic acid group, a sulfonamide group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an arylphosphine group, or a heterocyclic group containing at least one of N, O, and S atoms,
L' is a direct bond, —O—, —CO—, —S—, —$SO_2$—, —$C(CH_3)_2$—, —$C(CF_3)_2$—, —CONH—, —COO—, —$(CH_2)_z$—, —$O(CH_2)_zO$—, —$O(CH_2)_z$—, —NH—, —$NH(CH_2)_z$—NH—, —$NH(CH_2)_zO$—, —$OCH_2$—$C(CH_3)_2$—$CH_2O$—, —COO—$(CH_2)_z$—OCO—, or —OCO—$(CH_2)_z$—COO—, and
z is an integer of 1 to 10.

4. The photoresist composition according to claim 1, wherein $R_1$ and $R_2$ together form a cycloalkyl group having 7 to 10 carbon atoms.

5. The photoresist composition according to claim 1, wherein the (meth)acrylic resin is a polymer represented by Chemical Formula 5:

[Chemical Formula 5]

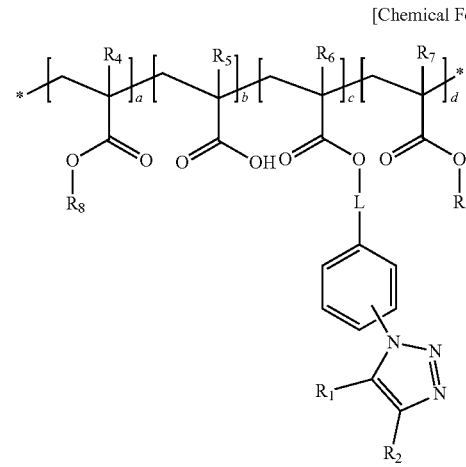

wherein, in the Chemical Formula 5, $R_1$ and $R_2$ are each independently hydrogen, a carboxy group, a polyoxyalkylene-based functional group, an alkyl group having 1 to 20 carbon atoms, or an aryl group having 6 to 20 carbon atoms, or $R_1$ and $R_2$ together form a cycloalkyl group having 3 to 20 carbon atoms, $R_4$ to $R_7$ are each independently hydrogen or a methyl group, $R_8$ is an alkyl group having 4 to 10 carbon atoms which can be deprotected by an acid, $R_{10}$ is a cycloalkyl group having 3 to 20 carbon atoms, a molar ratio of a:b:c:d is 3 to 6:0.5 to 2:2 to 5:1 to 5, L is a direct bond, —O—, —CO—, —S—, —$SO_2$—, —$C(CH_3)_2$—, —$C(CF_3)_2$—, —CONH—, —COO—, —$(CH_2)_y$—, —$O(CH_2)_yO$—, —$\{(CH_2)_yO\}_p$—, —NH—, —$NH(CH_2)_y$—NH—, —$NH(CH_2)_yO$—, —$OCH_2$—$C(CH_3)_2$—$CH_2O$—, —OCO—$(CH_2)_y$—OCO—, or —OCO—$(CH_2)_y$—COO—, and y and p are each independently an integer of 1 to 10.

6. The photoresist composition according to claim 5, wherein the $R_{10}$ is a polycyclic cycloalkyl group represented by the following Chemical Formula 6:

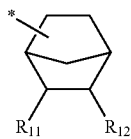

[Chemical Formula 6]

wherein, in the Chemical Formula 6, $R_{11}$ and $R_{12}$ are each independently hydrogen, an alkyl group having 1 to 20 carbon atoms, or an aryl group having 6 to 20 carbon atoms, or $R_{11}$ and $R_{12}$ together form a cycloalkyl group having 3 to 20 carbon atoms.

7. The photoresist composition according to claim 1, wherein the $R_{10}$ is a polycyclic cycloalkyl group represented by the following Chemical Formula 6:

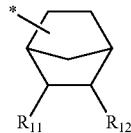

[Chemical Formula 6]

wherein, in the Chemical Formula 6, $R_{11}$ and $R_{12}$ are each independently hydrogen, an alkyl group having 1 to 20 carbon atoms, or an aryl group having 6 to 20 carbon atoms, or $R_{11}$ and $R_{12}$ together form a cycloalkyl group having 3 to 20 carbon atoms.

8. The photoresist composition according to claim 1, further comprising a hydroxystyrene resin in an amount of 1 to 90 parts by weight based on 100 parts by weight of the (meth)acryl resin.

9. The photoresist composition according to claim 8, wherein the hydroxystyrene resin contains a protecting group containing an acetal group or a tert-butyloxycarbonyl group (t-boc).

10. The photoresist composition according to claim 1, wherein the photoresist composition further includes at least one additive selected from the group of an acid diffusion control agent, a plasticizer, a surfactant, a photoinitiator, and a dissolution inhibitor.

11. The photoresist composition according to claim 1, wherein the photoresist composition contains less than 0.0001% by weight of a corrosion inhibitor that includes a triazine thiol compound or a triazole compound.

12. A photoresist film wherein a ratio of a footing length to a photoresist film thickness is 0.05 or less, wherein the photoresist film includes a cured product of a photoresist composition of claim 1.

* * * * *